(12) United States Patent
    Shih

(10) Patent No.: US 10,818,625 B1
(45) Date of Patent: Oct. 27, 2020

(54) ELECTRONIC DEVICE

(71) Applicant: NANYA TECHNOLOGY CORPORATION, New Taipei (TW)

(72) Inventor: Shing-Yih Shih, New Taipei (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/446,087

(22) Filed: Jun. 19, 2019

(51) Int. Cl.
  *H01L 23/00* (2006.01)
  *H01L 23/498* (2006.01)
  *H01L 23/522* (2006.01)

(52) U.S. Cl.
  CPC ........ *H01L 24/06* (2013.01); *H01L 23/49833* (2013.01); *H01L 23/522* (2013.01); *H01L 24/48* (2013.01); *H01L 24/73* (2013.01); *H01L 2224/48227* (2013.01); *H01L 2224/73265* (2013.01); *H01L 2924/01014* (2013.01); *H01L 2924/049* (2013.01); *H01L 2924/14* (2013.01)

(58) Field of Classification Search
  CPC ............. H01L 51/56; H01L 2251/5338; H01L 51/0097; H01L 27/3246; H01L 51/0072
  USPC ......................................................... 257/734
  See application file for complete search history.

(56) References Cited

U.S. PATENT DOCUMENTS

| | | | |
|---|---|---|---|
| 2004/0004284 A1* | 1/2004 | Lee .......................... | H01L 24/05 |
| | | | 257/737 |
| 2017/0084558 A1* | 3/2017 | Seo .......................... | H01L 24/02 |

FOREIGN PATENT DOCUMENTS

| | | |
|---|---|---|
| TW | 200524066 A | 7/2005 |
| TW | 201438229 A | 10/2014 |
| TW | 201712745 A | 4/2017 |

OTHER PUBLICATIONS

Office Action dated Apr. 14, 2020 related to Taiwanese Application No. 108127168.

* cited by examiner

*Primary Examiner* — Andy Huynh
(74) *Attorney, Agent, or Firm* — Muncy, Geissler, Olds & Lowe, P.C.

(57) ABSTRACT

An electronic device is provided. The electronic device includes a substrate, at least one contact pad disposed on the substrate, and a redistribution layer including a strip-shaped portion. The redistribution layer is electrically connected to the contact pad. The strip-shaped portion includes at least two strip-shaped steps, and each of the strip-shaped steps includes a plurality of peaks and valleys.

10 Claims, 2 Drawing Sheets

ELECTRONIC DEVICE

TECHNICAL FIELD

The present disclosure relates to an electronic device, and more particularly, to an electronic device having a redistribution layer with a strip-shaped portion.

DISCUSSION OF THE BACKGROUND

The semiconductor integrated circuit (IC) industry continues to improve the integration density of electronic components by continual reductions in minimum feature size, which allow more components to be integrated into a given area. These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Such scaling down has also increased the complexity of processing and manufacturing ICs and, for these advances to be realized, similar developments in IC manufacturing are needed.

In the pursuit of higher device density, greater performance, and lower costs, challenges in both fabrication and design have resulted in the development of multilayer devices. The multilayer devices may include a plurality of interlayer dielectric layers (ILDs), one or more wiring layers sunk into the interlayer dielectric layers, and one or more vias interposed between two wiring layers. However, as the scaling down continues, it becomes more difficult to form a reliable via due to a thin metal deposition along the sidewalls of the interlayer dielectric layers.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides an electronic device, including a substrate, at least one contact pad disposed on the substrate, and a redistribution layer including a strip-shaped portion. The redistribution layer is electrically connected to the contact pad, the strip-shaped portion includes at least two strip-shaped steps, and each of the strip-shaped steps includes a plurality of peaks and valleys.

In some embodiments, each of the strip-shaped steps of the redistribution layer includes a riser part and a tread part.

In some embodiments, the strip-shaped portion of the redistribution layer tapers at positions of decreasing distance from the contact pad.

In some embodiments, a distance between the peaks of each of the strip-shaped steps is in a range between 0.5 μm and 5.0 μm.

In some embodiments, a height between the peaks and valleys of each of the strip-shaped steps is in a range between 1.0 μm and 5.0 μm.

In some embodiments, the redistribution layer is substantially a conformal layer.

In some embodiments, the electronic device further includes a passivation layer covering the substrate and the contact pad, and a dielectric layer disposed on the passivation layer.

In some embodiments, the redistribution layer penetrates through the dielectric layer and the passivation layer.

In some embodiments, the passivation layer includes silicon nitride, and the dielectric layer includes silicon dioxide.

In some embodiments, the substrate includes a semiconductor wafer.

Due to a strip-shaped pattern and a tapered profile of a sidewall, adhesion of the redistribution layer on the sidewalls of the dielectric layer can be enhanced, thereby increasing the reliability of the vias formed by the redistribution layer.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
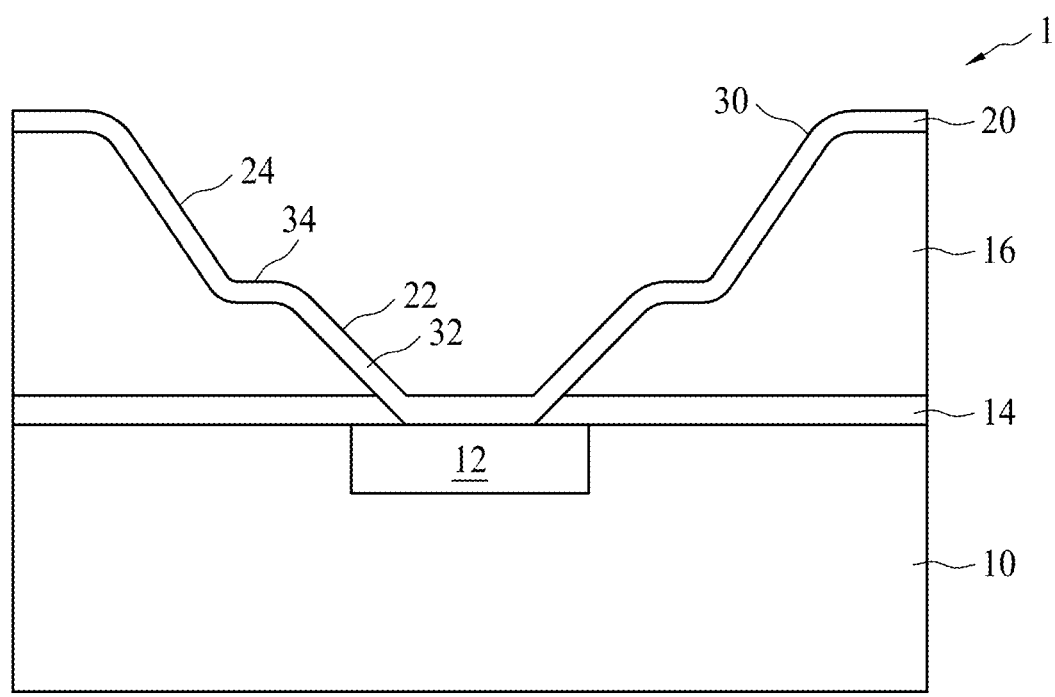
FIG. 1 is a cross-sectional view depicting an electronic device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
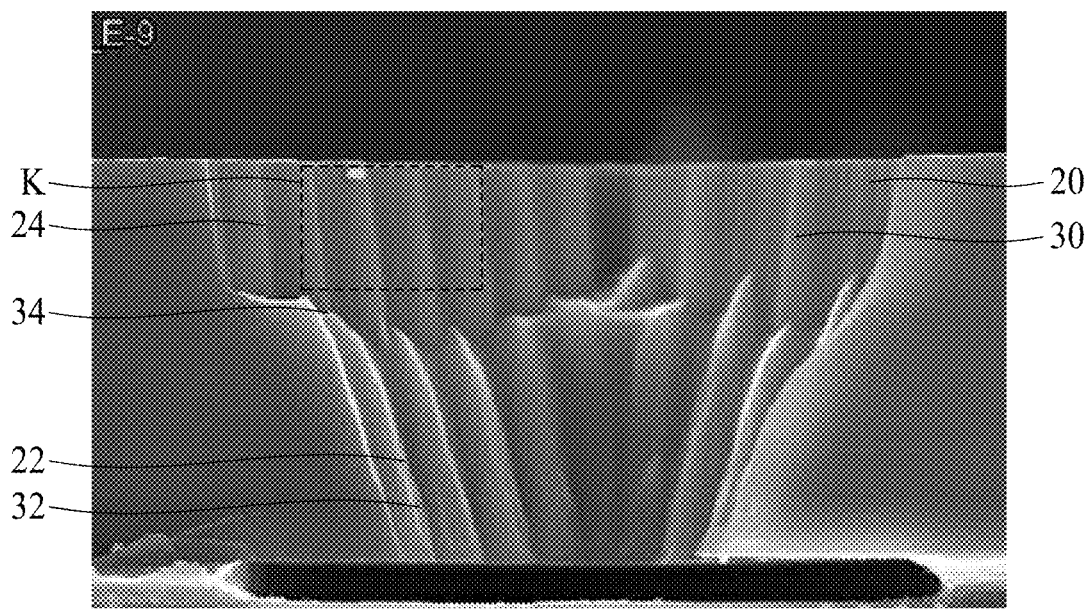
FIG. 2 is a perspective view depicting an electronic device in accordance with some embodiments of the present disclosure.
Figure 3:
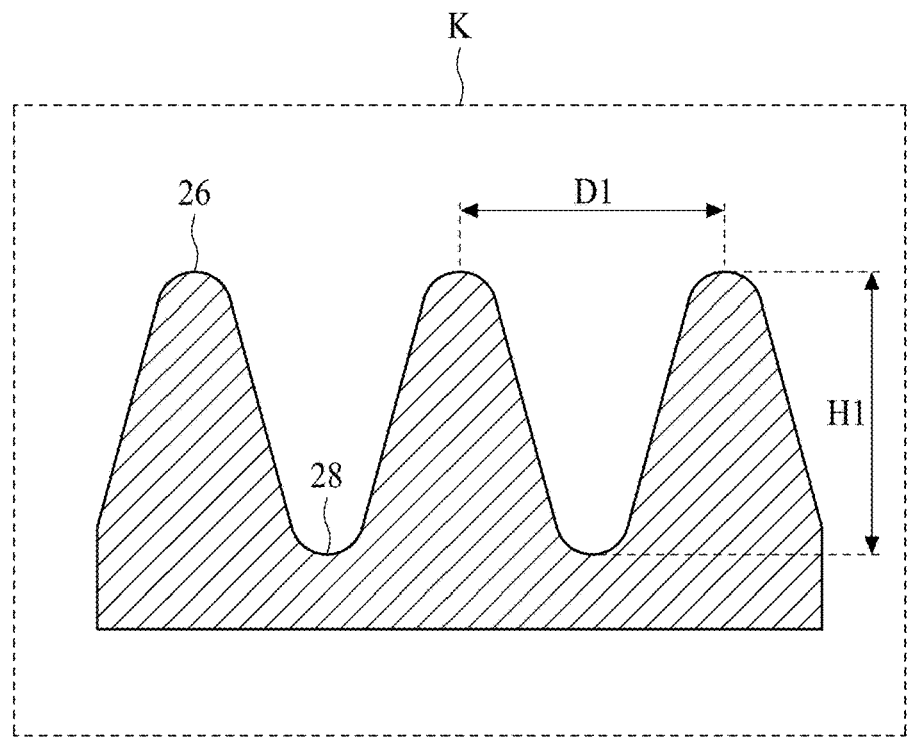
FIG. 3 is a top view of a section K of an electronic device in accordance with some embodiments of the present disclosure.

In accordance with some embodiments of the disclosure, FIG. 1 is a cross-sectional view of an electronic device 1, FIG. 2 is a perspective view of the electronic device 1, and FIG. 3 is a top view of a section K of the electronic device 1 shown in FIG. 2. With reference to FIG. 1 to FIG. 3, in some embodiments, the electronic device 1 includes a substrate 10, at least one contact pad 12 disposed on the substrate 10, and a redistribution layer 20 including a strip-shaped portion 30. The redistribution layer 20 is electrically connected to the contact pad 12. The strip-shaped portion 30 of the redistribution layer 20 includes at least two strip-shaped steps 22 and 24. As shown in FIG. 2 and FIG. 3, each of the strip-shaped steps 22 and 24 includes a plurality of peaks 26 and valleys 28.

In some embodiments, the electronic device 1 further includes a passivation layer 14 covering the substrate 10 and the contact pad 12, and a dielectric layer 16 disposed on the passivation layer 14. The redistribution layer 20 may also penetrate through the dielectric layer 16 and the passivation layer 14. In some embodiments, the passivation layer 14 may include silicon nitride ($Si_3N_4$), and the dielectric layer 16 may include silicon dioxide ($SiO_2$). Moreover, the substrate 10 may include a semiconductor wafer, which may be a silicon based wafer, semiconductor chip, or wafer portion, for example. The substrate 10 may include a plurality of alternating dielectric and metal interconnect layers overlying an upper metal layer (not shown) that may include the contact pad 12. It should be noted that the substrate 10 may also be any of a variety of other structures known to those skilled in the art including, but not limited to, ceramic and organic based substrates.

In some embodiments, with reference to FIG. 1, each of the strip-shaped steps 22 and 24 may include a riser part 32 and a tread part 34. Moreover, the strip-shaped portion 30 of the redistribution layer 20 may taper at positions of decreasing distance from the contact pad 12. Referring to FIG. 2 and FIG. 3, in some embodiments, a distance D1 between the peaks 26 of each of the strip-shaped steps 22 and 24 is in a range between 0.5 and 5.0 micrometers (μm), such as about 3.0 μm. Moreover, a height H1 between the peaks 26 and valleys 28 of each of the strip-shaped steps 22 and 24 is in a range between 1.0 and 5.0 μm, such as about 2.0 μm. In some embodiments, the redistribution layer 20 is a substantially conformal layer. It should be noted that, in some embodiments, the distance D1 between the peaks 26 of each of the strip-shaped steps 22 and 24, and the height H1 between the peaks 26 and valleys 28, may vary according to the distance from the contact pad 12.

Figure 4:
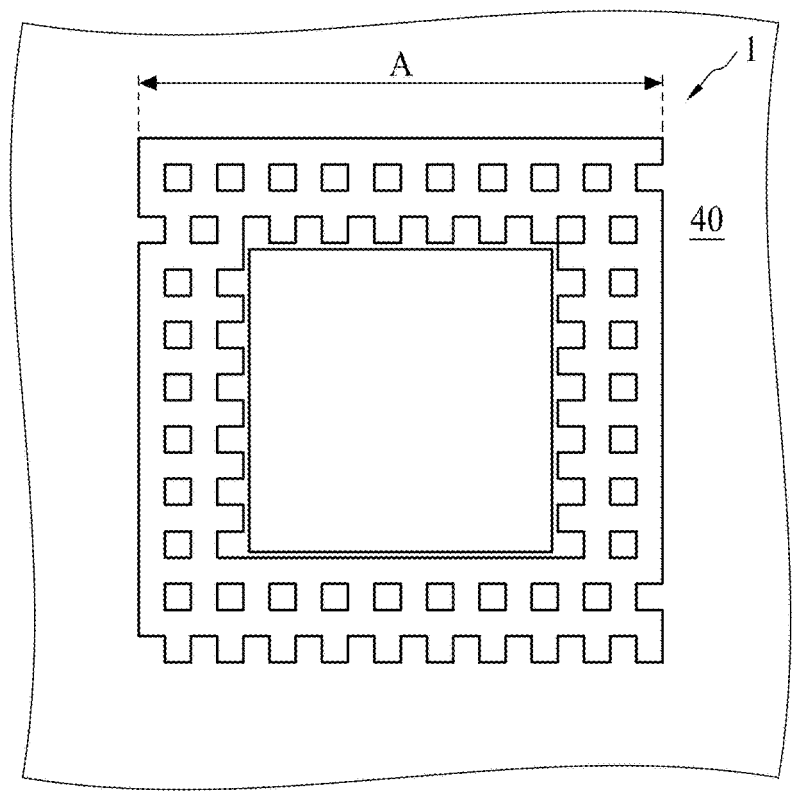
FIG. 4 is a top view illustrating a mask layer for etching a sacrificial layer according to some embodiments of the present disclosure.

In some embodiments, the electronic device may be fabricated in a process as described as follows. It should be noted that, the description of the fabrication process hereafter should not be construed as being limiting the fabrication process, and other variations of the fabrication process may be possible. FIG. 4 is a top view of a mask layer 40 for etching a sacrificial layer, according to some embodiments of the present disclosure. With reference to FIG. 1 and FIG. 4, the substrate 10 may be provided. In some embodiments, the substrate 10 may also include components such as transistors, resistors, capacitors, diodes, etc. In some embodiments, the substrate 10 may further include an interconnection structure, including alternating stacking of wiring layers and vias disposed over the components, and one or more interlayer dielectrics encircling the wiring layers and the vias (not shown). At least one contact pad 12 is formed on the substrate 10. In some embodiments, the contact pad 12 may be formed by steps including (1) depositing a blanket conductive layer (not shown), (2) providing a mask layer on the blanket conductive layer, (3) performing a photolithography process to define a pattern required to form the contact pad 12, (4) performing an etching process to remove portions of the blanket conductive layer exposed through the mask layer, and (5) removing the mask layer. In some embodiments, the blanket conductive layer may include aluminum, aluminum alloys, copper, copper alloys, titanium, tungsten, polysilicon, or a combination thereof, and the blanket conductive layer may be formed by a variety of techniques, e.g., physical vapor deposition (PVD), chemical vapor deposition (CVD), sputtering, or the like.

In some embodiments, the passivation layer 14 may be deposited over the substrate 10 and at least a portion of the contact pad 12. The passivation layer 14 may completely cover the contact pad 12, but in an alternative embodiment, the passivation layer 14 may have an opening formed therein which overlies the contact pad 12. The passivation layer 14 may be a silicon nitride ($Si_3N_4$) based material, for example. The dielectric layer 16 may be deposited on the passivation layer 14. The dielectric layer may be a silicon dioxide ($SiO_2$) material. In some embodiments, the passivation layer 14 and the dielectric layer 16 may be formed by a CVD process or other suitable process. A sacrificial layer may be formed over the dielectric layer 16. In some embodiments, the sacrificial layer may be a photoresist layer that is patterned by the mask layer 40 of FIG. 4 to form the contact pad 12 and the strip-shaped steps 22 and 24 of the redistribution layer 20. The mask layer 40 of FIG. 4 may include a plurality of dummy elements A which may enable the formation of the strip-shaped steps 22 and 24 due to an interference effect, for example. It should be noted that, in other embodiments, alternative arrangements of the dummy elements A in the mask layer 40 are possible. In some embodiments, the sacrificial layer may be patterned by steps including (1) exposing the sacrificial layer to a pattern (e.g., the mask layer 40 of FIG. 4), (2) performing a post-exposure back process, and (3) developing the sacrificial layer, thereby forming a photoresist pattern for the electronic device 1 of FIG. 1.

In some embodiments, the sacrificial layer, which may be a photoresist layer, may be etched in any manner known to those skilled in the art. For example, the sacrificial layer may be etched using a partial isotropic etch such as reactive ion etching with ozone, or laser trimming. The etching technique utilized may be anisotropic, which produces riser parts that may have a slightly tapered wall profile.

In some embodiments, the strip-shaped portion 30 of the redistribution layer 20 tapers at positions of decreasing distance from the contact pad 12. The redistribution layer 20 may be deposited by any of a variety of methods including, but not limited to, sputtering, electroplating, or electroless plating. The redistribution layer 20 may include aluminum, or a combination of aluminum and copper. Accordingly, due to a strip-shaped pattern and a tapered profile of a sidewall, adhesion of the redistribution layer 20 on the sidewalls of the dielectric layer 16 can be increased, thereby enhancing the reliability of the vias formed by the redistribution layer 20.

One aspect of the present disclosure provides an electronic device, including a substrate, at least one contact pad disposed on the substrate, and a redistribution layer including a strip-shaped portion. The redistribution layer is electrically connected to the contact pad, the strip-shaped portion includes at least two strip-shaped steps, and each of the strip-shaped steps includes a plurality of peaks and valleys.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. An electronic device, comprising:
   a substrate;
   at least one contact pad disposed on the substrate;
   a redistribution layer comprising a strip-shaped portion, wherein the redistribution layer is electrically connected to the contact pad, the strip-shaped portion comprises at least two strip-shaped steps, and each of the strip-shaped steps comprises a plurality of peaks and valleys;
   wherein the plurality of peaks and valleys are elongated along an extending direction of the strip-shaped portion, and the extending direction is from a bottom portion of the redistribution layer, which is connected to the contact pad, to a top portion of the redistribution layer, which is away from the bottom portion of the redistribution layer.

2. The electronic device of claim 1, wherein each of the strip-shaped steps of the redistribution layer comprises a riser part and a tread part.

3. The electronic device of claim 1, wherein the strip-shaped portion of the redistribution layer tapers at positions of decreasing distance from the contact pad.

4. The electronic device of claim 1, wherein a distance between the peaks of each of the strip-shaped steps is in a range between 0.5 μm and 5.0 μm.

5. The electronic device of claim 1, wherein a height between the peaks and valleys of each of the strip-shaped steps is in a range between 1.0 μm and 5.0 μm.

6. The electronic device of claim 1, wherein the redistribution layer is substantially a conformal layer.

7. The electronic device of claim 1, further comprising:
   a passivation layer covering the substrate and the contact pad; and
   a dielectric layer disposed on the passivation layer.

8. The electronic device of claim 7, wherein the redistribution layer penetrates through the dielectric layer and the passivation layer.

9. The electronic device of claim 7, wherein the passivation layer comprises silicon nitride, and the dielectric layer comprises silicon dioxide.

10. The electronic device of claim 1, wherein the substrate comprises a semiconductor wafer.

* * * * *